United States Patent
Yang et al.

(10) Patent No.: US 12,094,508 B1
(45) Date of Patent: Sep. 17, 2024

(54) MAGNETIC TUNNELING JUNCTION SWITCHING WITH PARALLEL SPIN-MOMENTUM LOCKED SPIN CURRENT

(71) Applicants: Samsung Electronics Co., Ltd., Gyeonggi-do (KR); INTERNATIONAL BUSINESS MACHINES CORPORATION, Armonk, NY (US)

(72) Inventors: See-Hun Yang, San Jose, CA (US); Mahesh Govind Samant, San Jose, CA (US); Panagiotis Charilaos Filippou, San Jose, CA (US); Chirag Garg, San Jose, CA (US); Fnu Ikhtiar, San Jose, CA (US); Jaewoo Jeong, San Jose, CA (US)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 18/509,818

(22) Filed: Nov. 15, 2023

(51) Int. Cl.
| | |
|---|---|
| *G11C 11/16* | (2006.01) |
| *H01F 10/32* | (2006.01) |
| *H10B 61/00* | (2023.01) |
| *H10N 50/01* | (2023.01) |
| *H10N 50/10* | (2023.01) |
| *H10N 50/85* | (2023.01) |

(52) U.S. Cl.
CPC .......... *G11C 11/161* (2013.01); *H01F 10/329* (2013.01); *H10B 61/00* (2023.02); *H10N 50/01* (2023.02); *H10N 50/10* (2023.02); *H10N 50/85* (2023.02)

(58) Field of Classification Search
CPC ..... G11C 11/161; H01F 10/329; H10B 61/00; H10N 50/01; H10N 50/10; H10N 50/85
See application file for complete search history.

(56) References Cited

U.S. PATENT DOCUMENTS

| | | |
|---|---|---|
| 9,355,698 B2 | 5/2016 | Naaman et al. |
| 11,005,029 B2 | 5/2021 | Jeong et al. |
| 11,430,943 B2 | 8/2022 | O'Brien et al. |

(Continued)

FOREIGN PATENT DOCUMENTS

| | | |
|---|---|---|
| EP | 3 570 283 | 11/2019 |
| WO | WO 2012/035355 | 3/2012 |
| WO | WO 2022/141306 | 7/2022 |

OTHER PUBLICATIONS

"Topological Engineering of Pt-Group-Metal-Based Chiral Crystals toward High-Efficiency Hydrogen Evolution Catalysts" Qun Yang, Advanced Materials, 2020, 32, pp. 1908518-1 to 1908518-7 (Yang) (Year: 2020).*

*Primary Examiner* — S M Sohel Imtiaz
(74) *Attorney, Agent, or Firm* — The Farrell Law Firm, P.C.

(57) ABSTRACT

Methods and apparatuses are provided for MRAM devices utilizing spin transfer torque. A device includes a substrate; an MTJ formed over the substrate, the MTJ including a reference layer, a tunnel barrier layer, and a free layer; and a PSM layer formed over the free layer of the MTJ. The PSM layer, i.e., a chiral material layer, may be formed adject to a free layer (or adjacent to a TBL, which is adjacent to the free layer) of the MTJ, providing an additional source of spin-transfer-torque, and providing MTJ devices that are operable with lower switching current.

17 Claims, 6 Drawing Sheets

(56) References Cited

U.S. PATENT DOCUMENTS

| | | | |
|---|---|---|---|
| 11,552,242 B2 | 1/2023 | Pereira de Sousa et al. | |
| 2010/0128510 A1 | 5/2010 | Cowburn | |
| 2012/0023386 A1* | 1/2012 | Oh | H10N 50/10 |
| | | | 714/E11.053 |
| 2015/0049542 A1* | 2/2015 | Naaman | H03K 19/0008 |
| | | | 365/158 |
| 2018/0301266 A1* | 10/2018 | Ou | G11C 11/161 |
| 2019/0165255 A1* | 5/2019 | Zhu | G11C 11/161 |
| 2020/0365653 A1* | 11/2020 | Tsai | G11C 11/161 |
| 2021/0210677 A1* | 7/2021 | Prasad | H01F 10/3286 |
| 2021/0273155 A1* | 9/2021 | Gottwald | H10N 50/10 |
| 2022/0068337 A1* | 3/2022 | Prasad | H10N 50/10 |
| 2022/0131067 A1* | 4/2022 | Kalitsov | H10N 50/10 |
| 2022/0131068 A1* | 4/2022 | Kalitsov | H10N 52/01 |
| 2022/0223783 A1 | 7/2022 | Jeong et al. | |
| 2023/0010525 A1 | 1/2023 | Yan et al. | |
| 2023/0116592 A1 | 4/2023 | Samsant et al. | |
| 2024/0016065 A1* | 1/2024 | Mihajlovic | H10N 50/85 |

* cited by examiner

MAGNETIC TUNNELING JUNCTION SWITCHING WITH PARALLEL SPIN-MOMENTUM LOCKED SPIN CURRENT

TECHNICAL FIELD

The disclosure relates generally to the field of magnetic random access memory (MRAM), and more particularly, to MRAM devices utilizing spin transfer torque.

BACKGROUND

Magnetic memories such as MRAMs store information utilizing magnetic materials as an information storage medium. For example, a magnetic tunneling junction (MTJ) may be used in an MRAM, such as a spin transfer torque MRAM (STT-MRAM). The MTJ typically includes a reference layer, a free layer, and a tunnel barrier layer between the reference and free layers. The reference and free layers are magnetic. The magnetic moment of the reference layer is generally fixed, or pinned, in a particular direction. The free layer has a changeable magnetic moment and is used to store information. A bottom contact below the MTJ and a top contact on the MTJ are used to drive current through the MTJ in a current-perpendicular-to-plane (CPP) direction in an STT-MRAM. In case of MTJs with positive tunnel magnetoresistance (TMR), when a sufficient current is driven in one direction perpendicular-to-plane (e.g., top to bottom), the free layer magnetic moment switches to be parallel to that of the reference layer. When a sufficient current is driven in the opposite direction (e.g., bottom to top), the free layer magnetic moment switches to be anti-parallel to that of the reference layer. Different magnetic configurations correspond to different magnetoresistances and thus different logical states (e.g. a logical "0" and a logical "1") of the MTJ.

More specifically, STT-MRAM changes the magnetic direction of the free layer by directly passing a spin-polarized current through the MTJ. This gives the STT-MRAMs scalability, meaning that the threshold current to perform the state reversal will decrease as the size of the MTJ becomes smaller. This characteristic also provides STT-MRAM greater immunity from stray magnetic fields compared to toggle MRAM.

Because STT-MRAM has advantages of lower power consumption and better scalability than conventional MRAM, it can replace low-density dynamic random access memory (DRAM) and static random access memory (SRAM), e.g., in mobile and storage devices. Another advantage of MRAM over DRAM and SRAM is its non-volatile nature, i.e., MRAM retains written data even in power off state.

However, in STT-MRAM, smaller switching currents are needed if the magnetic layers have magnetization perpendicular to a film surface, i.e., have perpendicular magnetic anisotropy (PMA), than for in-plane magnetized MTJs.

Additionally, lower switching currents are needed for low-power STT-MRAM products that can operate at a nanosecond regime (e.g., 2-50 ns).

A dual MTJ structure has been proposed to provide an additional source of spin-transfer-torque, but requires thicker MTJ stacks, which is a challenge for fabrication, and requires significant improvement for top reference layer stability.

Additionally, a spin-orbit coupling torque (SOT) assisted STT-MRAM has been proposed, in which an additional source of spin torque is provided by SOT material adjacent to a free layer of an MTJ. However, in these conventional technologies, the SOT is generated by in-plane electrical current flowing through an SOT line, which extends laterally and also presents additional challenges regarding fabrication.

SUMMARY

Accordingly, an aspect of the disclosure is to provide an apparatus and method for obtaining lower switching current in MTJ devices.

Another aspect of the disclosure is to provide an additional source of spin-transfer-torque for MTJ devices, without fabrication challenges.

In accordance with an aspect of the disclosure, a device is provided, which includes a substrate; an MTJ formed over the substrate, the MTJ including a reference layer, a tunnel barrier layer, and a free layer; and a parallel spin-momentum (PSM) layer formed over the free layer of the MTJ, the PSM layer including a chiral material.

In accordance with another aspect of the disclosure, a device is provided, which includes a substrate; a PSM layer formed over the substrate, the PSM layer including a chiral material; and an MTJ formed over the PSM layer, the MTJ including a free layer, a tunnel barrier layer, and reference layer.

In accordance with another aspect of the disclosure, a method is provided, which includes providing a substrate; and forming an MTJ and a PSM layer over the substrate. The MTJ includes a reference layer, a tunnel barrier layer, and a free layer, and the PSM layer is formed adjacent to the free layer of the MTJ, and includes a chiral material.

In accordance with another aspect of the disclosure, an electronic device is provided, which includes a processor; and a memory device including an MTJ including a reference layer, a tunnel barrier layer, and a free layer, and a PSM layer formed over the free layer of the MTJ, the PSM layer including a chiral material.

BRIEF DESCRIPTION OF THE DRAWING

The above and other aspects, features, and advantages of the disclosure will be more apparent from the following detailed description taken in conjunction with the accompanying drawings, in which.

DETAILED DESCRIPTION

Figure 1A:
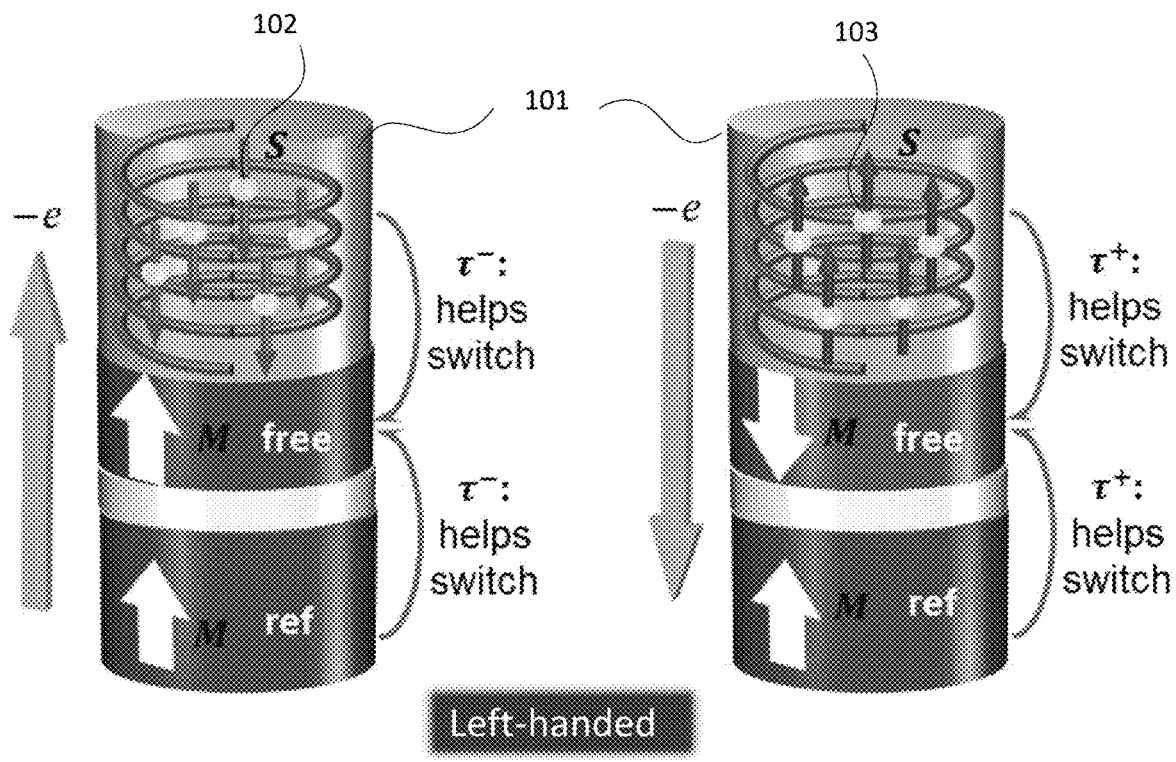
FIG. 1A illustrates a left handed PSM layer on a free layer of an MTJ, according to an embodiment.

In the following detailed description, numerous specific details are set forth in order to provide a thorough understanding of the disclosure. It will be understood, however, by those skilled in the art that the disclosed aspects may be practiced without these specific details. In other instances, well-known methods, procedures, components and circuits have not been described in detail to not obscure the subject matter disclosed herein.

Reference throughout this specification to "one embodiment" or "an embodiment" means that a particular feature, structure, or characteristic described in connection with the embodiment may be included in at least one embodiment disclosed herein. Thus, the appearances of the phrases "in one embodiment" or "in an embodiment" or "according to one embodiment" (or other phrases having similar import) in various places throughout this specification may not necessarily all be referring to the same embodiment. Further, the particular features, structures or characteristics may be combined in any suitable manner in one or more embodiments. In this regard, as used herein, the word "exemplary" means "serving as an example, instance, or illustration." Any embodiment described herein as "exemplary" is not to be construed as necessarily preferred or advantageous over other embodiments.

Additionally, the particular features, structures, or characteristics may be combined in any suitable manner in one or more embodiments. Also, depending on the context of discussion herein, a singular term may include the corresponding plural forms and a plural term may include the corresponding singular form. Similarly, a hyphenated term (e.g., "two-dimensional," "pre-determined," "pixel-specific," etc.) may be occasionally interchangeably used with a corresponding non-hyphenated version (e.g., "two dimensional," "predetermined," "pixel specific," etc.), and a capitalized entry (e.g., "Counter Clock," "Row Select," "PIX-OUT," etc.) may be interchangeably used with a corresponding non-capitalized version (e.g., "counter clock," "row select," "pixout," etc.). Such occasional interchangeable uses shall not be considered inconsistent with each other.

Also, depending on the context of discussion herein, a singular term may include the corresponding plural forms and a plural term may include the corresponding singular form. It is further noted that various figures (including component diagrams) shown and discussed herein are for illustrative purpose only, and are not drawn to scale. The dimensions of some of the elements may be exaggerated relative to other elements for clarity. For example, the dimensions of layers and regions may be exaggerated for clarity of illustration.

Further, if considered appropriate, reference numerals may be repeated among the figures to indicate corresponding and/or analogous elements. That is, the same reference numerals may be used across two or more figures to refer to parts, components, blocks, circuits, units, or modules having the same or similar functionality. Such usage is, however, for simplicity of illustration and ease of discussion only; it does not imply that the construction or architectural details of such components or units are the same across all embodiments or such commonly-referenced parts/modules are the only way to implement some of the example embodiments disclosed herein.

The terminology used herein is for the purpose of describing some example embodiments only and is not intended to be limiting of the claimed subject matter. As used herein, the singular forms "a," "an" and "the" are intended to include the plural forms as well, unless the context clearly indicates otherwise.

As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

When an element or layer is referred to as being on, "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items.

The terms "first," "second," etc., as used herein, are used as labels for nouns that they precede, and do not imply any type of ordering (e.g., spatial, temporal, logical, etc.) unless explicitly defined as such.

Unless otherwise defined, all terms (including technical and scientific terms) used herein have the same meaning as commonly understood by one of ordinary skill in the art to which this subject matter belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As used herein, the term "module" refers to any combination of software, firmware and/or hardware configured to provide the functionality described herein in connection with a module. For example, software may be embodied as a software package, code and/or instruction set or instructions, and the term "hardware," as used in any implementation described herein, may include, for example, singly or in any combination, an assembly, hardwired circuitry, programmable circuitry, state machine circuitry, and/or firmware that stores instructions executed by programmable circuitry. The modules may, collectively or individually, be embodied as circuitry that forms part of a larger system, e.g., but not limited to, an IC, system on-a-chip (SoC), an assembly, etc.

Embodiments of the disclosure relate to MTJ devices and methods of manufacturing MTJ devices.

Embodiments relate to magnetic junctions usable in magnetic devices, such as magnetic memories, and the devices using such magnetic junctions. The magnetic memories may include STT-MRAMs, SOT memories, and may be used in electronic devices employing nonvolatile memory. Other devices including magnetic junctions, particularly, STT or SOT programmable magnetic junctions, include but are not limited to logic, neuromorphic computing cells, and other devices. Electronic devices include but are not limited to cellular phones, smart phones, tables, laptops and other portable and non-portable computing devices.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted, the term "selective to," such as, for example, "a first element selective to a second element," means that a first element can be etched, and the second element can act as an etch stop.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), etc. Semiconductor doping is the modification of electrical properties by doping, e.g., transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the structures that make up an IC device, lithography and etch pattern transfer steps are repeated multiple times. Each pattern being printed on the wafer is aligned to the previously formed patterns and slowly the conductors, insulators and selectively doped regions are built up to form the final device.

As described above, an aspect of the disclosure is to provide an apparatus and method for obtaining lower switching current in MTJ devices. More specifically, the disclosure provides additional sources of spin-transfer-torque for MTJ devices, thereby allowing for lower switching current.

In accordance with the embodiments, a PSM layer, i.e., a chiral material layer, may be formed adject to a free layer of an MTJ device, providing an additional source of spin-transfer-torque. By utilizing the chiral layer, spin currents that are induced by chiral materials are non-reciprocal and spin and momentum are parallel locked, making the chiral layer compatible with magnetic structures having perpendicular magnetic anisotropy.

Further, a PSM layer may be placed adjacent to a perpendicularly magnetized magnetic free layer, which is consistent with conventional two-terminal MTJ devices, thereby alleviating fabrication issues associated with previous sources of additional spin-transfer-torque for MTJ devices.

Additionally, compared with conventional double tunnel junctions, an MTJ including a PSM layer according to an embodiment provides more margin and has less concerns about interfaces. There are also a lot more materials available for fabrication.

FIG. 1A illustrates a left handed PSM layer on a free layer of an MTJ, according to an embodiment.

Referring to FIG. 1A, left handed PSM layer 101 is formed, e.g., grown, on a free layer of an MTJ including the free layer, a reference layer, and a tunnel barrier layer between the reference layer and the free layer.

Spin currents 102 and 103 that are generated from the PSM layer 101 are non-reciprocal. The consequent torque from the spin currents 102 and 103 help switch the free layer for both directions by simply reversing the current flow directions. That is, the spin currents 102 and 103 and their associated torques induced by the PSM layer 101 can be added to the STT current from the reference layer, thus amplifying the total torque. Further, as handedness of the PSM layer 101, e.g., left handed in FIG. 1A, is robust and fixed, the spin currents 102 and 103 and spin polarization are determined by current direction only.

Figure 1B:
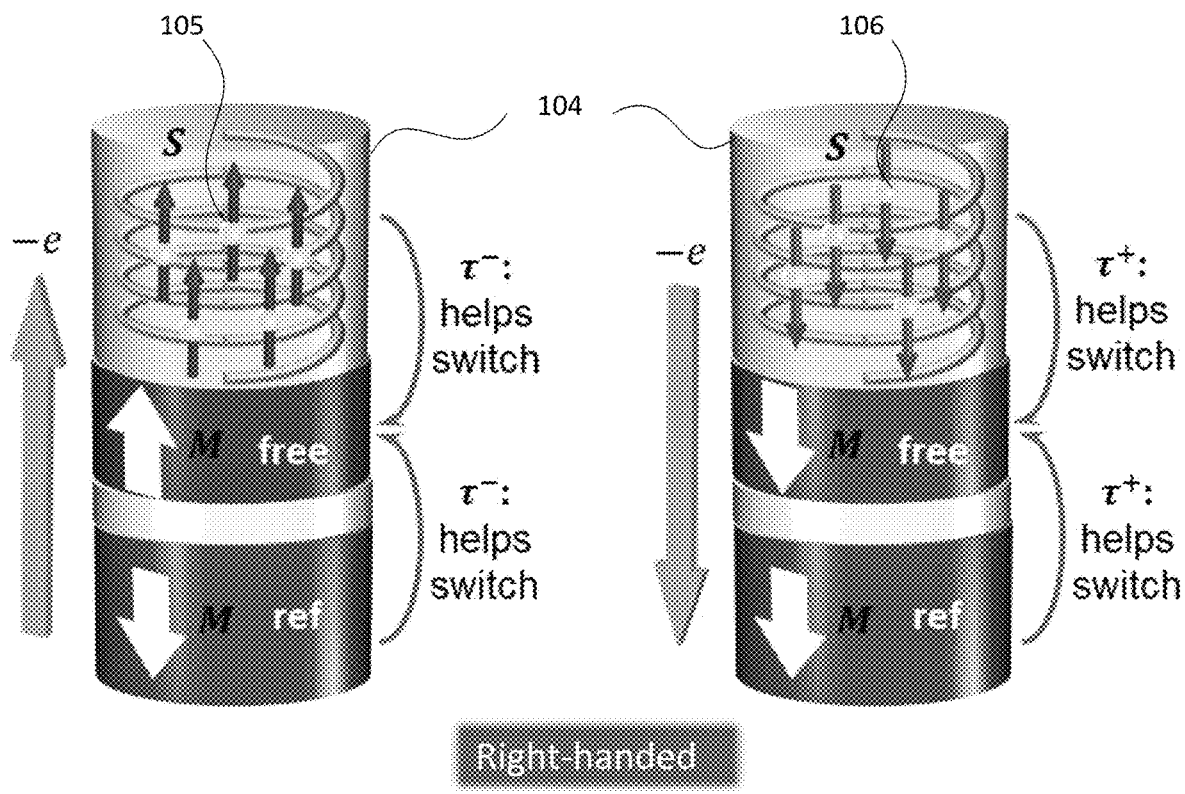
FIG. 1B illustrates a right handed PSM layer on a free layer of an MTJ, according to an embodiment.

FIG. 1B illustrates a right handed PSM layer on a free layer of an MTJ, according to an embodiment.

Referring to FIG. 1B, a right handed PSM layer 104 is formed, e.g., grown, on a free layer of an MTJ including the free layer, a reference layer, and a tunneling layer between the reference layer and the free layers.

Spin currents 105 and 106 that are generated from the PSM layer 104 are non-reciprocal. Similar to FIG. 1A, the consequent torque from the spin currents 105 and 106 help switch the free layer for both directions by simply reversing the current flow directions. That is, the spin currents 105 and 106 and their associated torques induced by the PSM layer 101 can be added to the STT current from the reference layer, thus amplifying the total torque.

As illustrated in FIGS. 1A and 1B, depending on the reference layer magnetization and chirality of the PSM layer material, the spin transfer torques from PSM layers and reference layers add to each other. That is, by changing current direction, the spin transfer torque from a PSM layer may be added to the spin transfer torque from a reference layer, thereby allowing for lower switching currents. The selection of a chiral material having left handed chirality or right handed chirality in the PSM layer is based on, i.e., chosen to match, the magnetization of the reference layer.

Figure 2A:
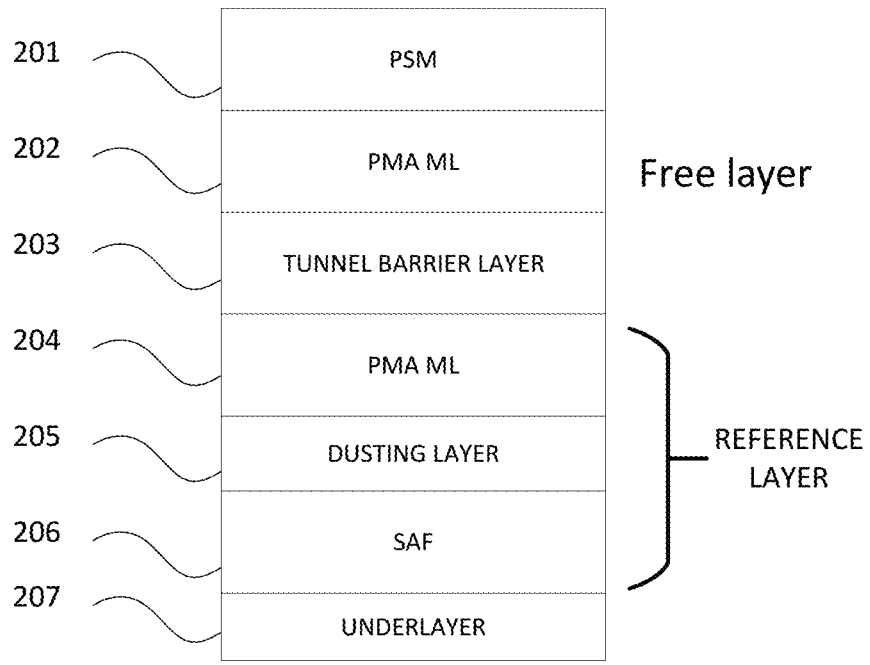
FIG. 2A is a cross-sectional side view of a top free layer MTJ stack including a PSM layer, according to an embodiment.

FIG. 2A is a cross-sectional side view of a top free layer MTJ stack including a PSM layer, according to an embodiment.

Referring to FIG. 2A, the top free layer MTJ stack includes a PSM layer 201, a PMA magnetic layer (ML) 202, a tunnel barrier layer 203, a PMA ML 204, a dusting layer 205, a synthetic anti-ferromagnet (SAF) layer 206, and an underlayer (and/or substrate) 207. The PMA ML 202 is the free layer of the MTJ stack, and the PMA ML 204, the dusting layer 205, and the SAF layer 206 form the reference layer of the MTJ stack.

The PMA ML 202, which is the free layer of the MTJ stack, may be formed as a CoFeB layer. Herein, a CoFeB layer refers to an alloy of Co, Fe, and B without referring to specific stoichiometry.

The PMA ML 202 may also be form of a Heusler compound, such as $Mn_3Ge$, or a C38 compound such as AlMnGe. In one or more embodiments, the Heusler compound may be a tetragonal Heusler compound, such as $Mn_3Z$ in which Z is Ge, Sn, or Sb. In one or more embodiments, the Heusler compound may be $Mn_3Sn$, $Mn_3Sb$, $Mn_2CoSn$, $Mn_2FeSb$, $Mn_2CoAl$, $Mn_2CoGe$, $Mn_2CoSi$, $Mn_2CuSi$, $Co_2CrAl$, $Co_2CrSi$, $Co_2MnSb$, or $Co_2MnSi$. All the Heusler compounds are listed with their stoichiometric formulas and these compounds may be grown with some variations from the stoichiometric composition.

The tunnel barrier layer 203 may include MgO. Also, magnesium aluminum oxide may be a suitable alternative to MgO with magnesium aluminum oxide having the form $Mg_{1-z}Al_{2+(2/3)z}O_4$, wherein $-0.5<z<0.5$.

The dusting layer 205, e.g., a layer of Ta, is a thin layer of material, e.g., a 0.3 nm-thick, that can be inserted into a structure to magnetic couple the magnetic layer 204 to the SAF 206. Alternately, Ta may be replaced by Ir, Ru, or Mo.

The SAF layer 206 may include two magnetic layers separated by a spacer.

The underlayer 207 may include $TaN/IrMn_3$, $TaN/IrMn_3/TaN$, CoGa, or CoAl. The underlayer 207 may include Pt, Ru, Ir, Ta, CoFeB, CoFeBTa, TaB, TiN, or TaN. The underlayer 207 may include a combination of at least two of the above-mentioned materials that form a bilayer structure or a multilayered structure.

As described above, by changing an applied current direction, spin transfer torque from the PSM layer 201 may be added to spin transfer torque from the reference layer, i.e., the PMA ML 204, the dusting layer 205, and the SAF layer 206, thereby allowing for lower switching currents. The selection of a chiral material having left handed chirality or right handed chirality in the PSM layer 201 is chosen to match the reference layer.

The PSM layer 201 may include material chosen from B20 or C40 structures or other chiral structures (cubic, trigonal, tetragonal and hexagonal), and may have a thickness >2-3 nm.

The B20 structure is a cubic crystal structure with low internal symmetry. It has neither 4-fold rotation symmetry nor inversion symmetry in the lattice. The B20 structure can be fully determined by three structural parameters: a lattice parameter, a; and two internal parameters, u and v. Examples of B20 structures include PtAl, BeAu, CoGe, CoSi, FeGe, PdGa, MnGe, RhGe, HfSb, HfSn, ZrSb, MnSi, FeSi, PtGa, RhSi, RuSi, NiSi, MnGe, CrSi, CrGe, PtMg, ReSi, RhSn, ZrSb, PdAl, and PtAl.

C40 is part of hexagonal space group #180 with short name $P6_222$. Examples of C40 structures include $TaGe_2$, $TaSi_2$, $VGe_2$, $HfSn_2$, $NbGe_2$, $MoSi_2$, $VSi_2$, $WSi_2$, $CrSi_2$, $WAl_2$, $HfSn_2$, and $NiMg_2$.

Examples of other chiral structures with chiral symmetrical groups that may be utilized include $IrGe_4$, $Hf5Ir_3$, $NbGe_2$, $WAl_2$, $\beta$-RhSi, $Mg_3Ru_2$, and $YSb_2$.

The PSM layer 201 may also include topological materials with low symmetries.

The PSM layer 201 includes more than 50% of a chiral material having either left handed or right handed chirality. For example, the chiral material may be PtAl or PtGa.

Figure 2B:
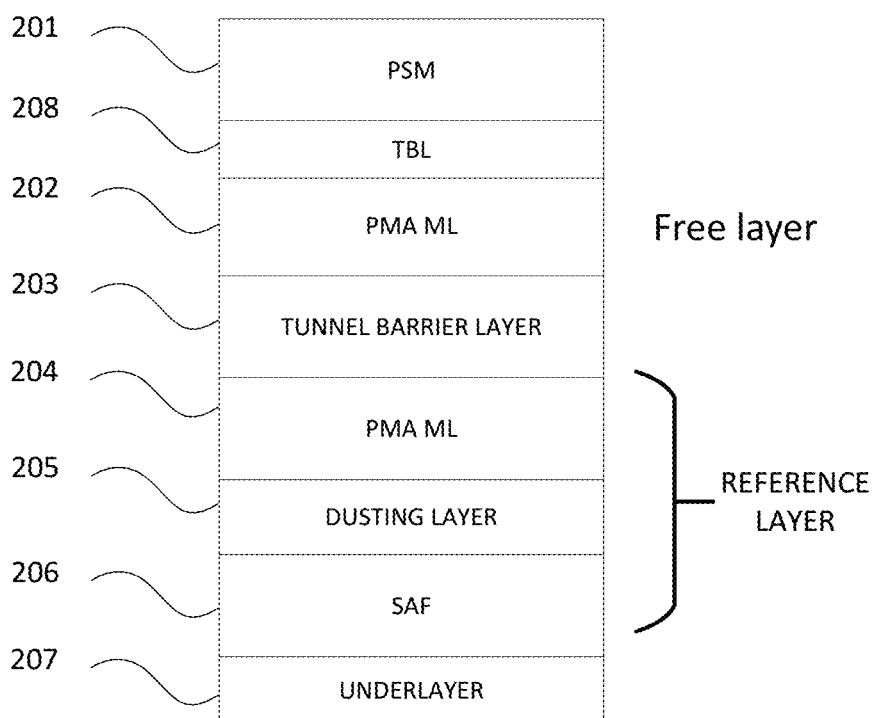
FIG. 2B is a cross-sectional side view of a top free layer MTJ stack including a PSM layer, according to another embodiment.

FIG. 2B is a cross-sectional side view of a top free layer MTJ stack including a PSM layer, according to another embodiment.

Referring to FIG. 2B, the top free layer MTJ stack includes a PSM layer 201, a PMA ML 202, a tunnel barrier layer 203, a PMA ML 204, a dusting layer 205, an SAF layer 206, and an underlayer 207, as in FIG. 2A, but also includes a texture breaking layer (TBL) 208 inserted between PSM layer 201 and the PMA ML 202. That is, the PSM layer 201 may be interfaced directly with the PMA ML 201 as illustrated in FIG. 2A, or separated by a spacer layer such as the TBL 208 as illustrated in FIG. 2B.

The TBL 208 may be used to induce a larger magnetic anisotropy in CoFeB, i.e., the PMA ML 202. As such, the TBL 208 may include a high spin conductance layer such as NiO.

As described above, a PSM layer is compatible with a top free layer MTJ, which has many advantages, e.g., a reference layer is highly thermally stable with a relatively larger magnetic exchange coupling to the PMA magnetic layer, Hex, current MRAM products often use a top free layer MTJ, etc. However, a PSM layer can also be incorporated in a bottom free layer in an MTJ.

Figure 3A:
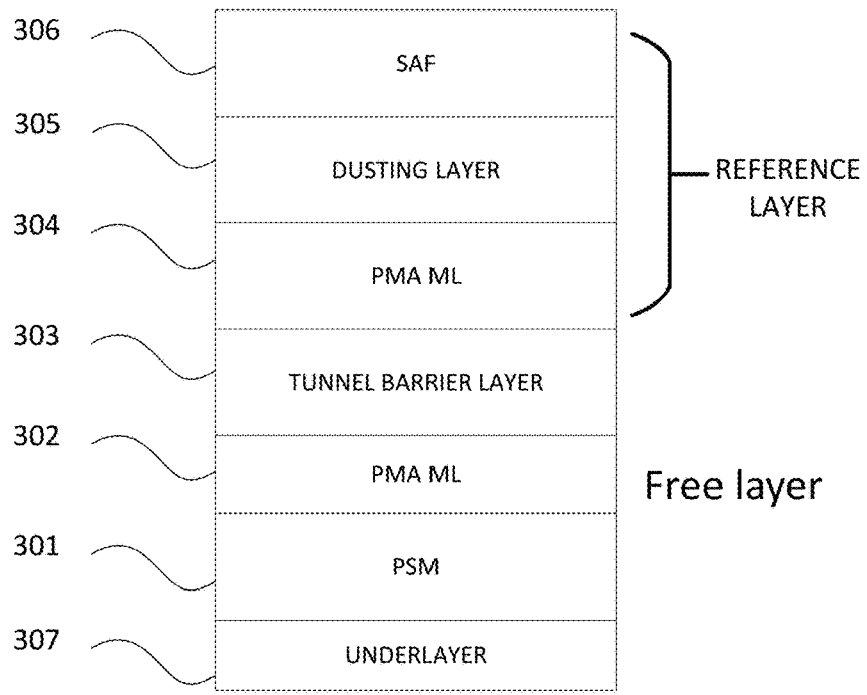
FIG. 3A is a cross-sectional side view of a bottom free layer MTJ stack including a PSM layer, according to an embodiment.

FIG. 3A is a cross-sectional side view of a bottom free layer MTJ stack including a PSM layer, according to an embodiment.

Referring to FIG. 3A, the bottom free layer MTJ stack includes an SAF layer 306, a dusting layer 305, a PMA ML 304, a tunnel barrier layer 303, a PMA ML 302, a PSM layer 301, and an underlayer 307. The PMA ML 302 is the free layer of the MTJ stack, and the PMA ML 304, the dusting layer 305, and the SAF layer 306 form the reference layer of the MTJ stack.

Aside from the order of the layers above the underlayer 307 being reversed in FIG. 3A, the structure of the bottom free layer MTJ stack is similar to that of the top free layer MTJ stack illustrated in FIG. 2A and described above. Accordingly, a repetitive description of each of the layers is omitted here.

Figure 3B:
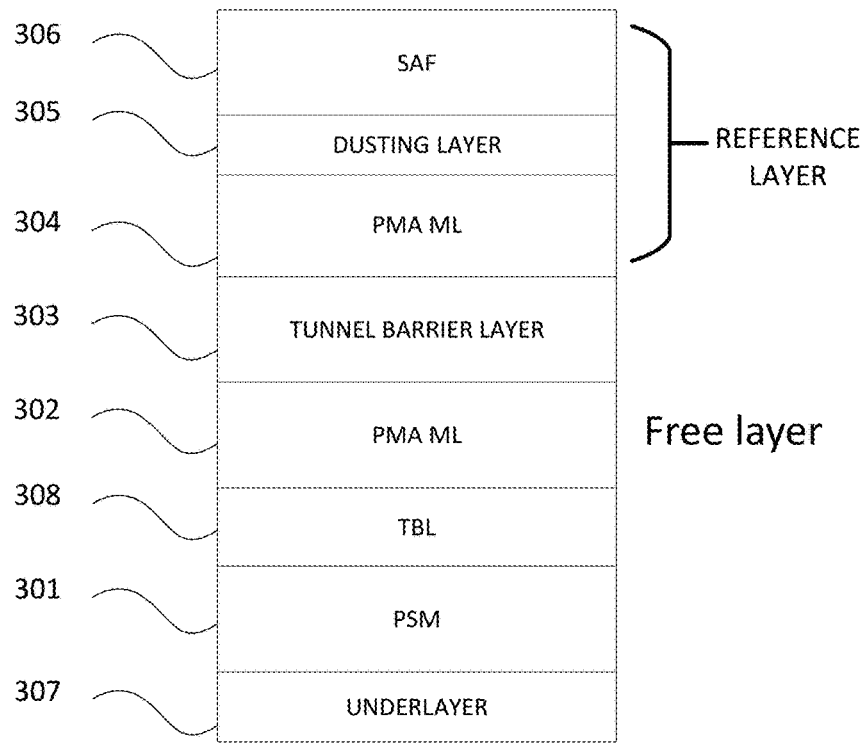
FIG. 3B is a cross-sectional side view of a bottom free layer MTJ stack including a PSM layer, according to another embodiment.

FIG. 3B is a cross-sectional side view of a bottom free layer MTJ stack including a PSM layer, according to another embodiment.

Referring to FIG. 3B, the bottom free layer MTJ stack includes an SAF layer 306, a dusting layer 305, a PMA ML 304, a tunnel barrier layer 303, a PMA ML 302, a PSM layer 301, and an underlayer 307, as in FIG. 3A, but also includes a TBL 308 inserted between PSM layer 301 and the PMA ML 302. That is, the PSM layer 301 may be interfaced directly with the PMA ML 301 as illustrated in FIG. 3A, or separated by a spacer layer such as the TBL 308 as illustrated in FIG. 2B.

A cap layer may be present above the MTJ stacks illustrated in FIGS. 2A, 2B. 3A, and 3B.

Figure 4:
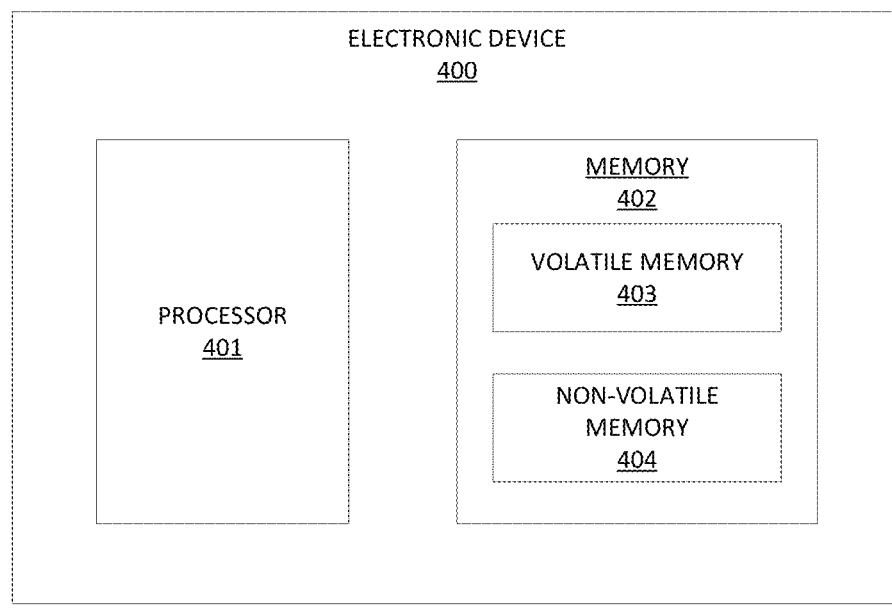
FIG. 4 illustrates an electronic device, according to an embodiment.

FIG. 4 illustrates an electronic device, according to an embodiment.

Referring to FIG. 4, an electronic device 400, e.g., a user equipment (UE) or a mobile terminal, includes a processor 401 and a memory 402. Although not illustrated in FIG. 4, dependent on the type of the electronic device 400, the electronic device 400 may include various additional components, such as an input device, a sound output device, a display device, an audio module, a sensor module, an interface, a haptic module, a camera module, a power management module, a battery, a communication module, a subscriber identification module (SIM), and/or an antenna module.

The processor 401 may execute, for example, software (e.g., a program) to control at least one other component (e.g., a hardware or a software component) of the electronic device 400, and may perform various data processing or computations. As at least part of the data processing or computations, the processor 401 may load a command or data received from another component in volatile memory 403, process the command or the data stored in the volatile memory 403, and store resulting data in non-volatile memory 404. The processor 401 may include a main processor (e.g., a central processing unit (CPU) or an application processor, and an auxiliary processor (e.g., a graphics processing unit (GPU), an image signal processor (ISP), a sensor hub processor, or a communication processor (CP)) that is operable independently from, or in conjunction with, the main processor.

The memory 402 may store various data used by at least one component (e.g., the processor 401) of the electronic device 400. The various data may include, for example, software (e.g., the program) and input data or output data for a command related thereto. The memory 402 may include the volatile memory 403 or the non-volatile memory 404. The non-volatile memory 404 includes an MTJ stack including a PSM layer, e.g., as illustrated in FIGS. 2A, 2B, 3A, and 3B.

Figure 5:
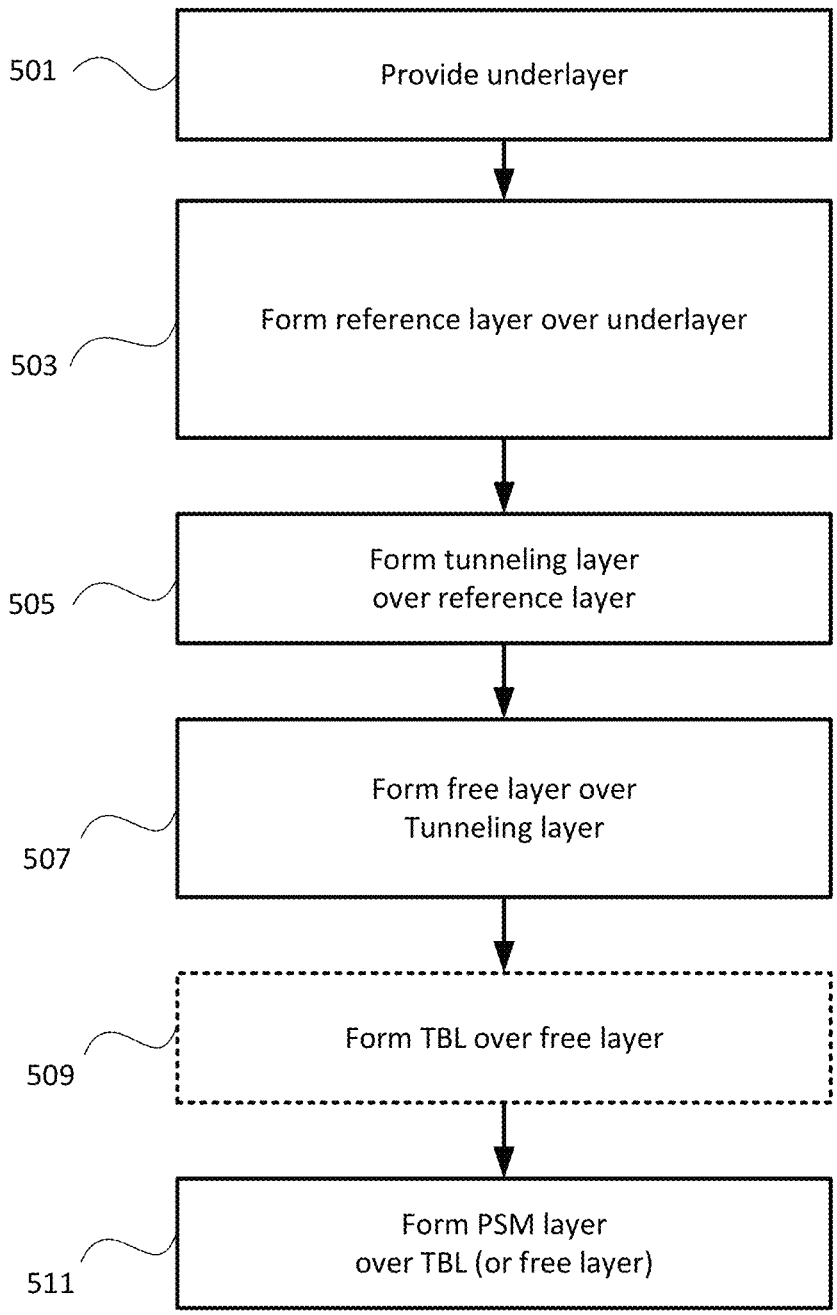
FIG. 5 is a flowchart illustrating a method of forming a top free layer MTJ stack including a PSM layer, according to an embodiment.

FIG. 5 is a flowchart illustrating a method of forming a top free layer MTJ stack including a PSM layer, according to an embodiment.

Referring to FIG. 5, in step 501, an underlayer is provided. The underlayer may include TaN/IrMn$_3$, TaN/IrMn$_3$/TaN, CoGa, or CoAl. The underlayer 207 may include Pt, Ru, Ir, Ta, CoFeB, CoFeBTa, TaB, TiN, or TaN. The underlayer 207 may include a combination of at least two of the above-mentioned materials that form a bilayer structure or a multilayered structure.

In step 503, a reference layer is formed over the underlayer. The reference layer may include an SAF layer, a dusting layer, and a PMA ML.

In step 505, a tunnel barrier layer, e.g., MgO, is formed over the reference layer.

In step 507, a free layer, e.g., another PMA ML, is formed over the tunnel barrier layer.

In step 509, a TBL may be formed over the free layer.

In step 511, a PSM layer is formed over the TBL.

As described above, the PSM layer may be interfaced directly with the free layer, as illustrated in FIG. 2A, or separated by a spacer layer such as the TBL, as illustrated in FIG. 2B. Therefore, step 509 may be optional.

In the event that step 509 is not performed, the PSM layer is formed over the free layer in step 511.

Figure 6:
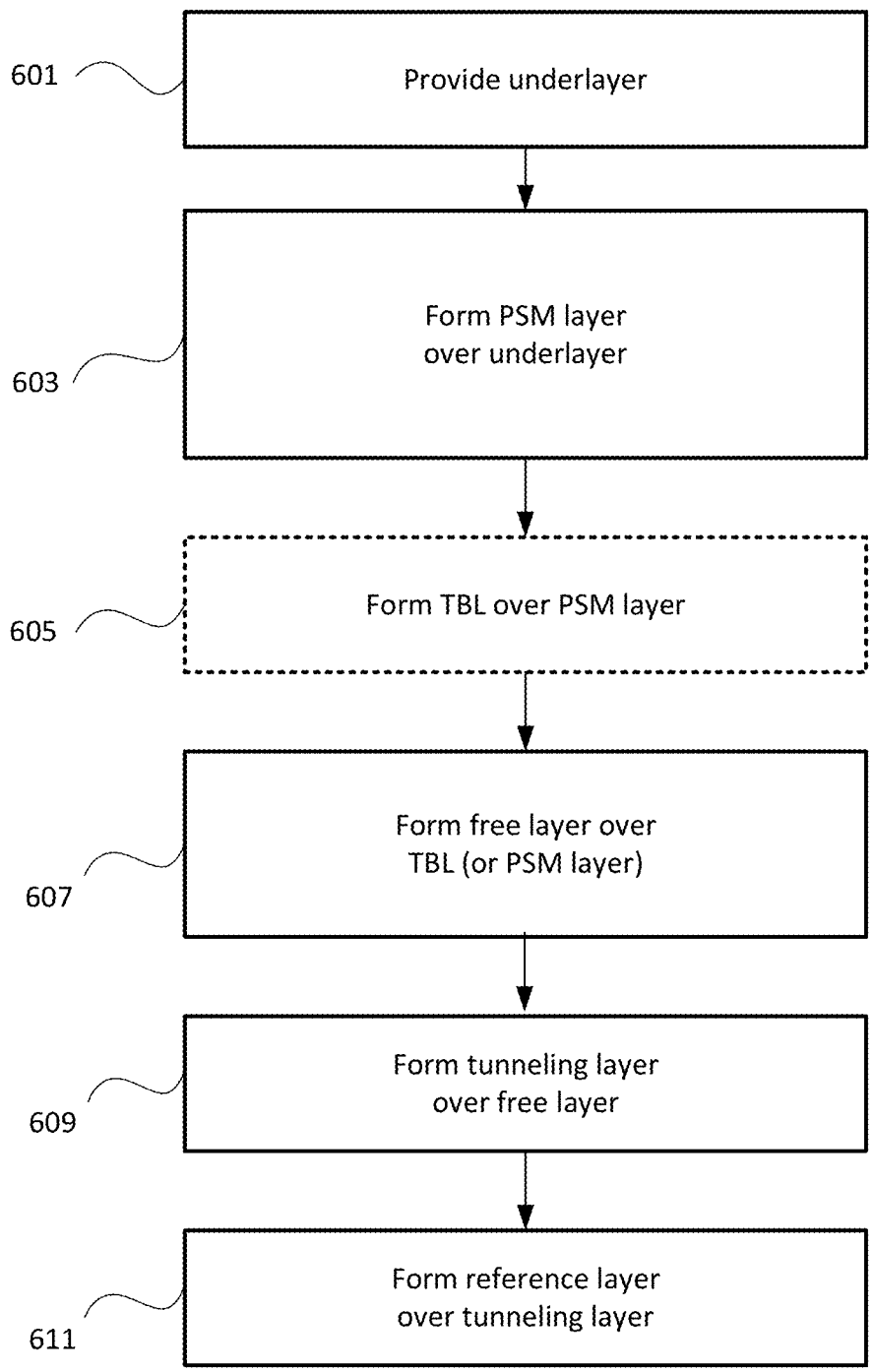
FIG. 6 is a flowchart illustrating a method of forming a bottom free layer MTJ stack including a PSM layer, according to an embodiment.

FIG. 6 is a flowchart illustrating a method of forming a bottom free layer MTJ stack including a PSM layer, according to an embodiment. Basically, the method in FIG. 6, aside from the initial underlayer, is a reverse of the method in FIG. 5.

Referring to FIG. 6, in step 601, an underlayer is provided.

In step 603, a PSM layer is formed over the underlayer.

In step 605, a TBL may be formed over the PSM layer.

In step 607, a free layer, e.g., a PMA ML, is formed over the TBL. As described above, the PSM may be interfaced directly with the free layer, as illustrated in FIG. 3A, or separated by a spacer layer such as the TBL, as illustrated in FIG. 3B. Therefore, step 605 may be optional.

In the event that step 605 is not performed, the free layer is formed over the PSM layer in step 607.

In step 609, a tunnel barrier layer, e.g., MgO, is formed over the free layer.

In step 611, a reference layer is formed over the tunnel barrier layer. The reference layer may include a PMA ML, a dusting layer, and an SAF layer.

In accordance with the above-described embodiments, a PSM layer, i.e., a chiral material layer, may be formed adject to a free layer (or adjacent to a TBL, which is adjacent to the free layer) of an MTJ device, providing an additional source of spin-transfer-torque, and providing MTJ devices that are operable with lower switching current.

Embodiments of the subject matter and the operations described in this specification may be implemented in digital electronic circuitry, or in computer software, firmware, or hardware, including the structures disclosed in this specification and their structural equivalents, or in combinations of one or more of them. Embodiments of the subject matter described in this specification may be implemented as one or more computer programs, i.e., one or more modules of computer-program instructions, encoded on computer-storage medium for execution by, or to control the operation of data-processing apparatus. Alternatively or additionally, the program instructions can be encoded on an artificially-generated propagated signal, e.g., a machine-generated electrical, optical, or electromagnetic signal, which is generated to encode information for transmission to suitable receiver apparatus for execution by a data processing apparatus. A computer-storage medium can be, or be included in, a computer-readable storage device, a computer-readable storage substrate, a random or serial-access memory array or device, or a combination thereof. Moreover, while a computer-storage medium is not a propagated signal, a computer-storage medium may be a source or destination of computer-program instructions encoded in an artificially-generated propagated signal. The computer-storage medium can also be, or be included in, one or more separate physical components or media (e.g., multiple CDs, disks, or other storage devices). Additionally, the operations described in this specification may be implemented as operations performed by a data-processing apparatus on data stored on one or more computer-readable storage devices or received from other sources.

While this specification may contain many specific implementation details, the implementation details should not be construed as limitations on the scope of any claimed subject matter, but rather be construed as descriptions of features specific to particular embodiments. Certain features that are described in this specification in the context of separate embodiments may also be implemented in combination in a single embodiment. Conversely, various features that are described in the context of a single embodiment may also be implemented in multiple embodiments separately or in any suitable subcombination. Moreover, although features may be described above as acting in certain combinations and even initially claimed as such, one or more features from a claimed combination may in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Thus, particular embodiments of the subject matter have been described herein. Other embodiments are within the scope of the following claims. In some cases, the actions set forth in the claims may be performed in a different order and still achieve desirable results. Additionally, the processes depicted in the accompanying figures do not necessarily require the particular order shown, or sequential order, to achieve desirable results. In certain implementations, multitasking and parallel processing may be advantageous.

While the present disclosure has been shown and described with reference to certain embodiments thereof, it will be understood by those skilled in the art that various changes in form and details may be made therein without departing from the spirit and scope of the disclosure as defined by the appended claims and their equivalents.

What is claimed is:

1. A device, comprising:
   a substrate;
   a magnetic tunnel junction (MTJ) formed over the substrate, the MTJ including a reference layer, a tunnel barrier layer, and a free layer;
   a parallel spin-momentum (PSM) layer formed over the free layer of the MTJ, the PSM layer including a chiral material; and
   a texture breaking layer (TBL) formed between the free layer of the MTJ and the PSM layer.

2. The device of claim 1, wherein the chiral material has left handed chirality or right handed chirality corresponding to a magnetization orientation of the reference layer of the MTJ.

3. The device of claim 1, wherein the chiral material includes PtAl or PtGa.

4. The device of claim 1, wherein the PSM layer has a thickness >2-3 nm.

5. The device of claim 1, wherein the PSM layer includes more than 50% of a chiral material having left handed or right handed chirality.

6. The device of claim 1, wherein tunnel barrier layer of the MTJ includes MgO.

7. The device of claim 1, wherein the free layer of the MTJ includes an alloy of Co, Fe, and B.

8. The device of claim 1, wherein the free layer of the MTJ includes a Heusler compound.

9. The device of claim 8, wherein the Heusler compound includes $Mn_3Ge$.

10. The device of claim 1, wherein the free layer of the MTJ includes a C38 compound.

11. The device of claim 10, wherein the C38 compound includes AlMnGe.

12. A device, comprising:
    a substrate;
    a parallel spin-momentum (PSM) layer formed over the substrate, the PSM layer including a chiral material; and
    a magnetic tunnel junction (MTJ) formed over the PSM layer, the MTJ including a free layer, a tunnel barrier layer, and reference layer; and
    a texture breaking layer (TBL) formed between the free layer of the MTJ and the PSM layer.

13. The device of claim 12, wherein the chiral material has left handed chirality or right handed chirality corresponding to a magnetization orientation of the reference layer of the MTJ.

14. The device of claim 12, wherein the chiral material includes PtAl or PtGa.

15. The device of claim 12, wherein the PSM layer has a thickness >2-3 nm.

16. The device of claim 12, wherein the PSM layer includes more than 50% of a chiral material having left handed or right handed chirality.

17. A method, comprising:
    providing a substrate; and
    forming a magnetic tunnel junction (MTJ) and a parallel spin-momentum (PSM) layer over the substrate,
    wherein the MTJ includes a reference layer, a tunnel barrier layer, and a free layer,
    wherein the PSM layer is formed adjacent to the free layer of the MTJ, and includes a chiral material, and
    wherein a texture breaking layer (TBL) is formed between the free layer of the MTI and the PSM layer.

* * * * *